United States Patent [19]
Pearson

[11] 3,997,840
[45] Dec. 14, 1976

[54] PANEL METER WITH ADAPTER COVER

[75] Inventor: David B. Pearson, Raritan, N.J.

[73] Assignee: Weston Instruments, Inc., Newark, N.J.

[22] Filed: Dec. 12, 1974

[21] Appl. No.: 532,245

Related U.S. Application Data

[62] Division of Ser. No. 391,496, Aug. 24, 1973, Pat. No. 3,882,389, which is a division of Ser. No. 173,425, Aug. 20, 1971, Pat. No. 3,764,909.

[52] U.S. Cl. .............................. 324/156; 317/107
[51] Int. Cl.$^2$ ......................................... G01R 1/04
[58] Field of Search .......... 324/110, 115, 156, 154; 73/431; 317/104, 107

[56] References Cited

UNITED STATES PATENTS

| | | | |
|---|---|---|---|
| 1,631,684 | 6/1927 | Hoyle | 324/156 |
| 1,918,940 | 7/1933 | Triplett | 324/156 |
| 2,836,793 | 5/1958 | Kelly | 324/115 |
| 2,864,057 | 12/1958 | Connelly et al. | 324/156 |

OTHER PUBLICATIONS

Triplett Unimeters, Triplett Electrical Instrument Co. Catalogue, 5/10/58, 4 pages.

*Primary Examiner*—Gerard R. Strecker
*Attorney, Agent, or Firm*—William R. Sherman; Kevin McMahon; Walter Kruger

[57] ABSTRACT

A panel meter having a unique casing with an adapter on the casing. The meter movement is in a compartment of the casing and the adapter is secured to the casing and cooperates with the casing to define a compartment separate from the meter compartment. Components such as calibrating resistors and rectifiers can be installed, if required, in the separate compartment after the meter movement is installed in the casing. In the preferred embodiment, the casing has a configuration generally in the form of a segment of a cylinder, and the adapter has a segment configuration so that the casing and adapter present a generally cylindrical profile when joined. This arrangement permits using the same basic meter movement and casing to produce meters of different operating characteristics. The meter either with or without the adapter can be inserted through the usual circular opening of a mounting panel. The casing has toothed sides to retain a quick connect panel nut used to secure the meter to the panel.

13 Claims, 6 Drawing Figures

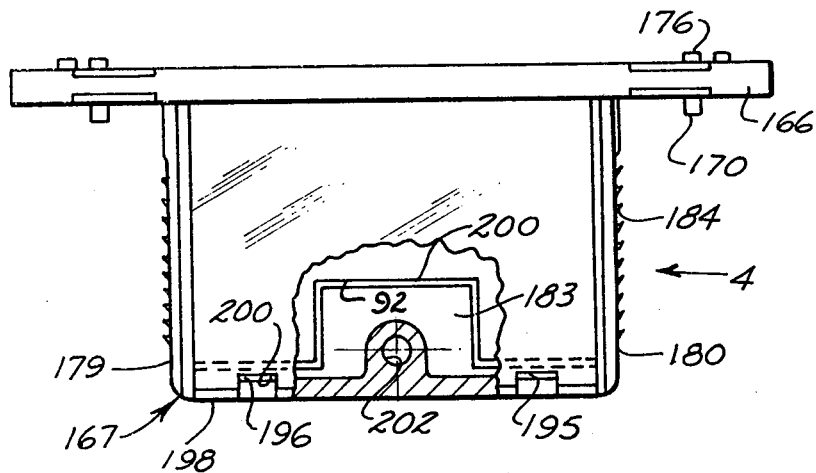
Fig. 3
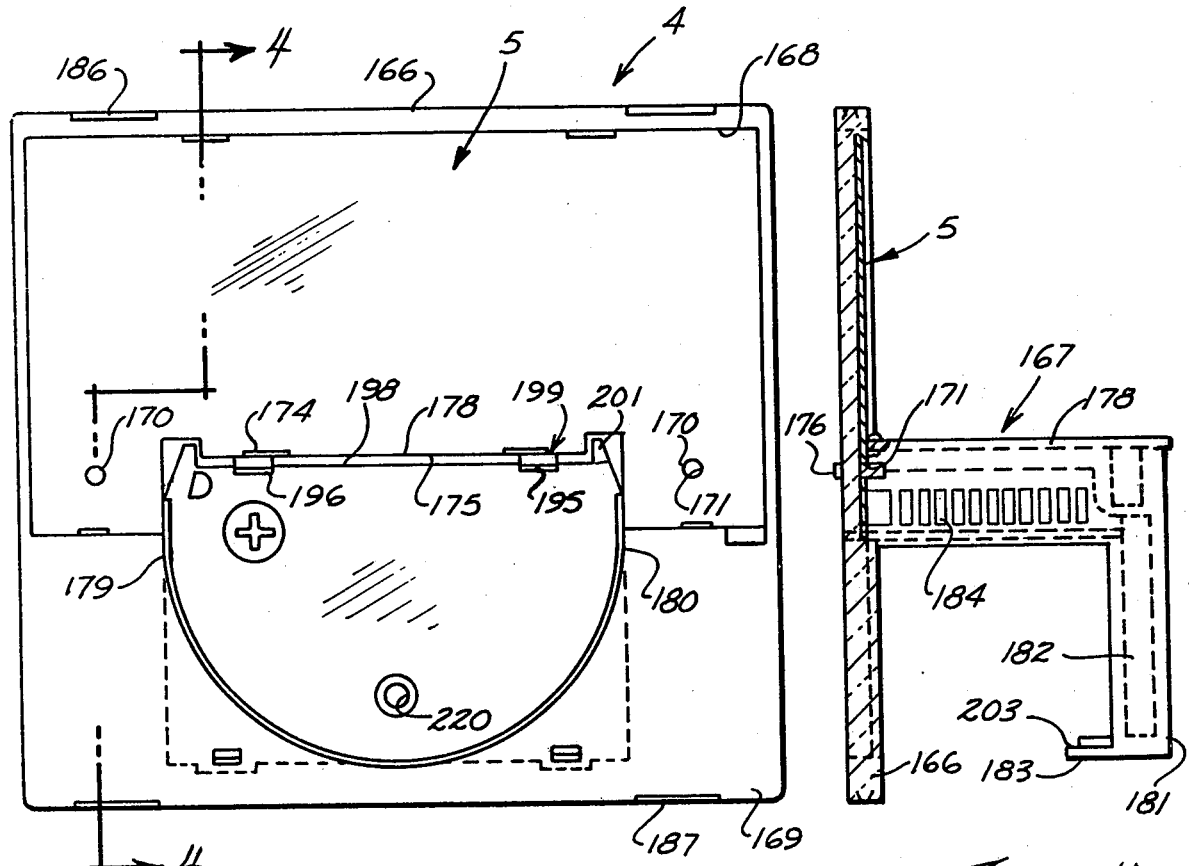
Fig. 2
Fig. 4

PANEL METER WITH ADAPTER COVER

This is a division of my copending application Ser. No. 391,496, filed Aug. 24, 1973, now U.S. Pat. No. 3,882,389, which is a division of application Ser. No. 173,425, filed Aug. 20, 1971, and which issued as U.S. Pat. No. 3,764,909 on Oct. 9, 1973.

This invention relates to a panel meter with a unique casing arrangement. More particularly, the invention relates to a panel meter having a unique casing arrangement which permits adding calibrating resistors or rectifiers to the meter after the meter is assembled, by the simple expedient of mounting such components in an adapter which cooperates with the meter casing to provide a compartment on the casing. The meter can be panel mounted either with or without the adapter, in a panel opening of predetermined size.

More specifically, the invention relates to a panel meter having a base for its meter movement which cooperates with a casing to provide a compartment housing the meter movement. The casing is of a part cylinder configuration (a segment of a cylinder) slightly greater than 180° in circumferential extent, and has a platform for receiving an adapter which is also in the form of a cylinder segment, the adapter and the casing cooperating to provide a generally cylindrical casing arrangement.

A distinct advantage of this panel meter casing construction is that the same meter movement, mounted on a base, can be used to provide various different sizes of meters with different deflection and measuring characteristics. Where resistors are used to vary the sensitivity of the meter, these resistors can be added after the meter is assembled. Similarly, where the meter is to be used for the measurement of alternating current, the meter can be adapted to such measurement by adding rectifiers within the adapter chamber, after the meter is assembled. Calibration of the meter can be accomplished by magnetizing the magnet of the meter after assembly.

Panel mounting is substantially simplified by use of a flexible Tinnerman type nut cooperating with preformed ratchet teeth on the body of the meter casing. The teeth and nut are so constructed that the same nut can be used to secure the meter in an opening of predetermined size in a panel, whether or not the adapter is used. In addition, only a single size opening is required for mounting any of a family of different size meters, whether or not the adapter is used. Advantageously, the various casing parts of the meter are of snap together construction so that the meter can be easily installed in its casing after the basic meter movement is assembled.

Numerous additional features and advantages of the invention will become apparent with reference to the drawings which form a part of this specification.

BRIEF DESCRIPTION OF THE DRAWINGS

FIG. 2 is a rear view of the meter case;

FIG. 3 is a top plan view of the meter case of FIG. 2 with portions broken away to show additional details;

FIG. 4 is a view in section taken along line 4—4 of FIG. 2;

THE METER ASSEMBLY

Figure 1:
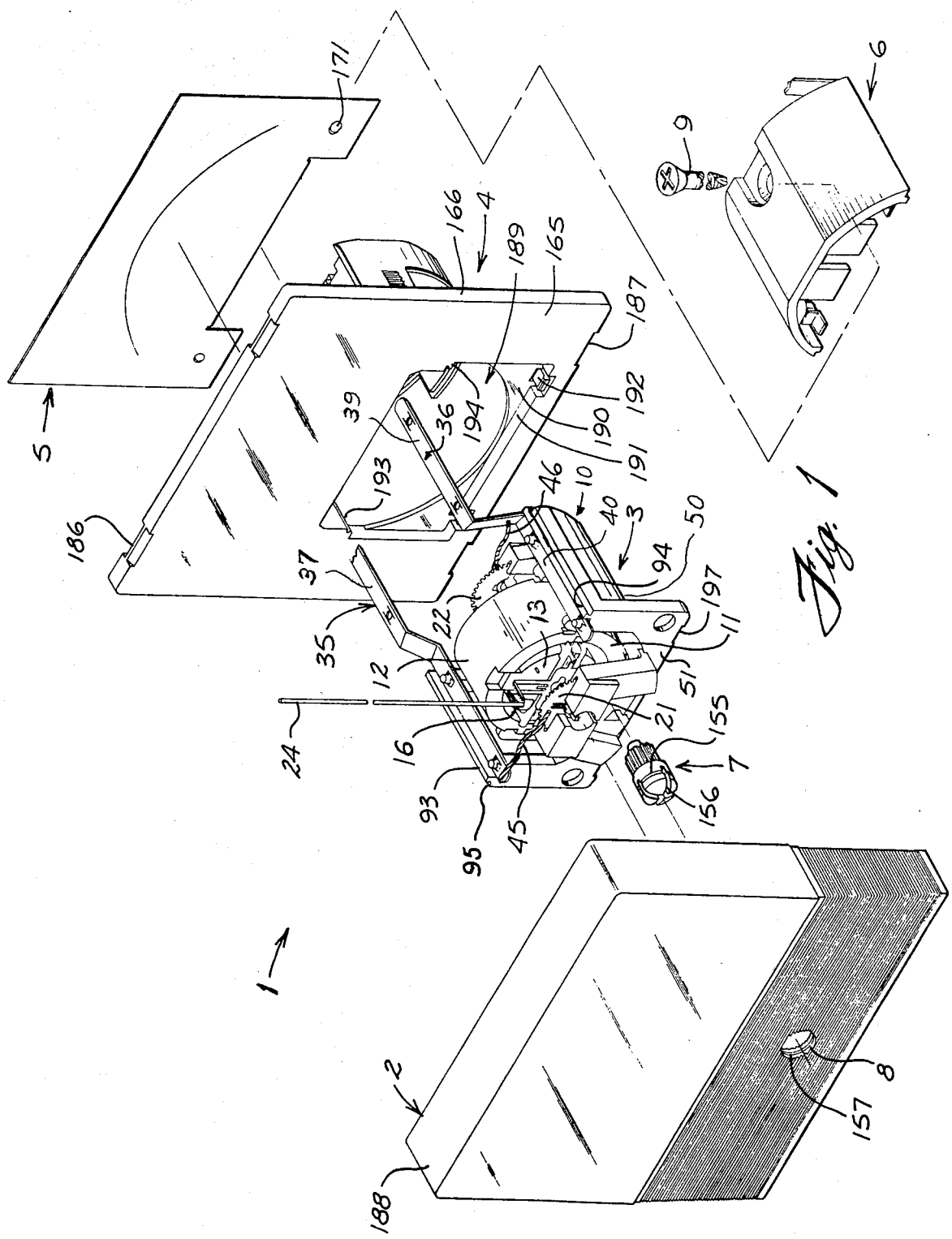
FIG. 1 is an exploded pictorial view of a panel meter having a casing and adaptor in accordance with this invention.

Referring now to the drawings and particularly to FIG. 1 there is shown a meter 1 constructed in accordance with this invention. As shown at FIG. 1, the meter includes a cover 2, a meter movement 3, a case 4, a scale 5 and a terminal adapter assembly 6. In addition, there is a zero adjust knob 7 which is mounted for rotation in an opening 8 in cover 2. The various parts of the meter so far described are adapted to be assembled by sliding and/or snapping these parts together with the exception of the terminal adapter 6 which is held in position by the screw 9, and which is only used where a particular meter terminal is needed.

A supporting base 10 supports all the components of meter movement 3. These components include upper and lower yoke pieces 11 and 12 between which is a permanent magnet 13, a coil assembly 16, supported by metal support elements 21 and 22 via metal taut bands, and conductors to electrically connect the coil to external terminals. A pointer 24 is mounted on coil assembly 16.

External electrical connections to the support elements 21 and 22 are made via the rigid terminal conductors 35 and 36 which are mounted on top of the base, and the terminal adaptor 6, when used. As shown at FIG. 1, conductors 35 and 36 are each formed from flat strips of metal and have good electrically conducting characteristics. Terminal 35 is bent intermediate its ends to elevate rear leg 37 of the conductor relative to front leg 38. Identically, conductor 36 is bent intermediate its ends so rear leg 39 is offset from and above front leg 40.

Conductor 35 is electrically connected to front support element 21 by a flexible braided wire conductor 45. Similarly, rear support element 22 is electrically connected to conductor 36 by a braided wire 46.

Base 10 is an integral structure molded from an electrically insulating plastic material with dimensionally stable characteristics, advantageously, a polysulfone material. The base has a front flange 51 and a rearwardly projecting side wall 50.

Projecting upwardly from wall 50 are longitudinal ribs 93 and 94. Each rib extends the length of the side wall as shown at FIG. 1 and has a groove 95 which seats in a mating projection in case 4 to hold the base against movement.

Case 4 is molded from an optically clear plastic material such as polystyrene. With reference to FIGS. 1-4, case 4 includes a face plate 166 and an integrally formed body 167 extending rearwardly from the face plate. Face plate 166 is generally rectangular and has a shallow recess 168 formed in the upper portion of its rear surface 169 to receive scale 5.

Scale 5 is precisely positioned in recess 168 by integrally formed cylindrical locating pins 170 which project rearwardly from face plate 166 and are received in locating openings 171 in the scale.

As shown at FIGS. 1-4, body 167 has a flat top wall 178 and side walls 179 and 180 which project downwardly from the top wall. There is also a rear wall 181 of slightly greater than semi-circular outline. A semi-circular flange 182 projects forwardly from rear wall 181. At the bottom of flange 182 is a forwardly projecting tab 183. Formed on the side walls 179 and 180 are ratchet type teeth 184 which face toward face plate 166 and provide for gripping a snap-on type retaining nut 185 (FIGS. 5 and 6) to facilitate mounting the meter on the front face of a panel.

Formed in the top edge of face plate 166 are a pair of notches 186 and formed at the bottom edge of the face plate are a pair of notches 187. As shown at FIG. 1, face plate 166 has a semi-circular opening 189 formed therein, the lower edge of which is defined by a wall 190 with a concave top edge. Extending from the front surface of the face plate to the wall 190 is a recess 191 with square lower corners. The bottom edge of the recess is notched to accommodate a pair of resilient, forwardly projecting latch fingers 192 integrally formed with case 4.

At the sides of opening 189, adjacent the upper portion of the opening are tracks 193 and 194 dimensioned to mate respectively with ribs 93 and 94. Tracks 193 and 194 extend the length of body 167 and permit sliding the base and meter movement into a seated position in the case. Horizontally elongated openings 195 and 196 are provided in rear wall 181 to receive conductors 35 and 36 of the meter movement.

The top of wall 178 of body 167 is provided with a step 198 in its rear edge as shown at FIGS. 2 and 3. This step terminates slightly above the openings 195 and 196. The openings 195 and 196 are each defined by an L-shaped notch 199 which extends through both the top wall 178 and rear wall 181. In addition, it will be observed with reference to FIG. 2 that the body 167 has upwardly projecting longitudinally extending ribs 201 along the opposite sides of top wall 178. Step 198 and ribs 201 provide a seat for conveniently mounting adapter assembly 6 on top of body 167. The rear of body 167 is provided with a thickened portion centrally thereof in which a blind opening 202 is formed to receive the screw 9 for securing the terminal adapter 6 to the casing.

Figure 5:
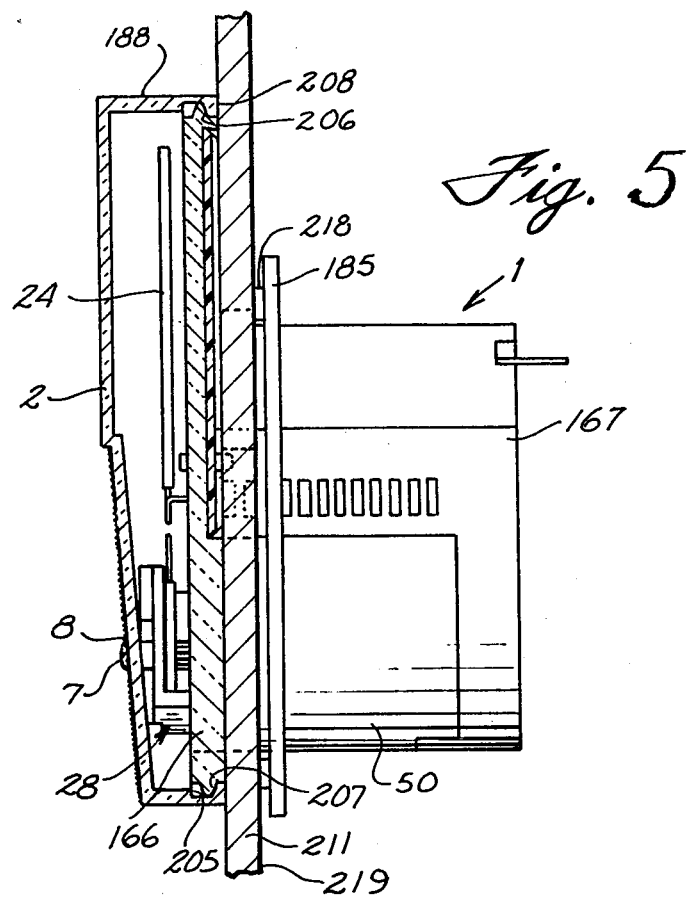
FIG. 5 is a side view in section of the assembled meter taken along line 5—5 of FIG. 6 and showing the assembled meter mounted on a panel.

To mount meter movement 3 in case 4, it is merely necessary to align ribs 93 and 94 at the top of base 10 with the tracks 193 and 194 of the case. The conductors 35 and 36 carried by the base 10 are substantially rigid and are accurately positioned on the base in alignment with the openings 195 and 196 respectively in rear wall 181. Hence, the assembled meter movement can be readily slipped into a seated position in the base merely by sliding the meter movement rearwardly until notches 197 on the bottom surface of the base snap over the retaining fingers 192 adjacent the front of the case 4. In this seated position of the meter movement, the rear face of flange 51 abuts the front face of wall 190, conductors 35 and 36 extend through the respective openings 195 and 196 in rear wall 181, and tab 183 seats in the recess 92 at the rear of the base. The position of the meter movement in the case 4 is shown at FIG. 5, where it is seen that the front support structure 28 projects slightly in front of the front surface of face plate 166. Side wall 50 of supporting base 10 forms a close fit with body 167 and tab 183 of the case to prevent dust from entering the assembly. In this regard, it will be observed with reference to FIGS. 3 and 4 that tab 183 has a flanged edge 203 which seats in a mating recess formed in the rear portion of the base along the side edges of the recess 92 of the base.

Cover 2 is formed from an optically clear plastic material such as polystyrene; is generally rectangular, and has a side wall 188 of a size to fit over face plate 166. The rear of side wall 188 has a rectangular recess with an inner edge 205 that forms an abutment surface against which the front surface of face plate 166 abuts when the cover is in position on the face plate. Formed at the rear edge of the cover are pairs of locking lugs 206 and 207 which are spaced apart and arranged to snap over the pairs of notches 186 and 187 of the face plate so the cover can be quickly snapped into position on the face plate and yet is held against accidental removal. As shown at FIG. 5 the rear edge 208 of side wall 188 is flush with the rear surface of face plate 166.

Figure 6:
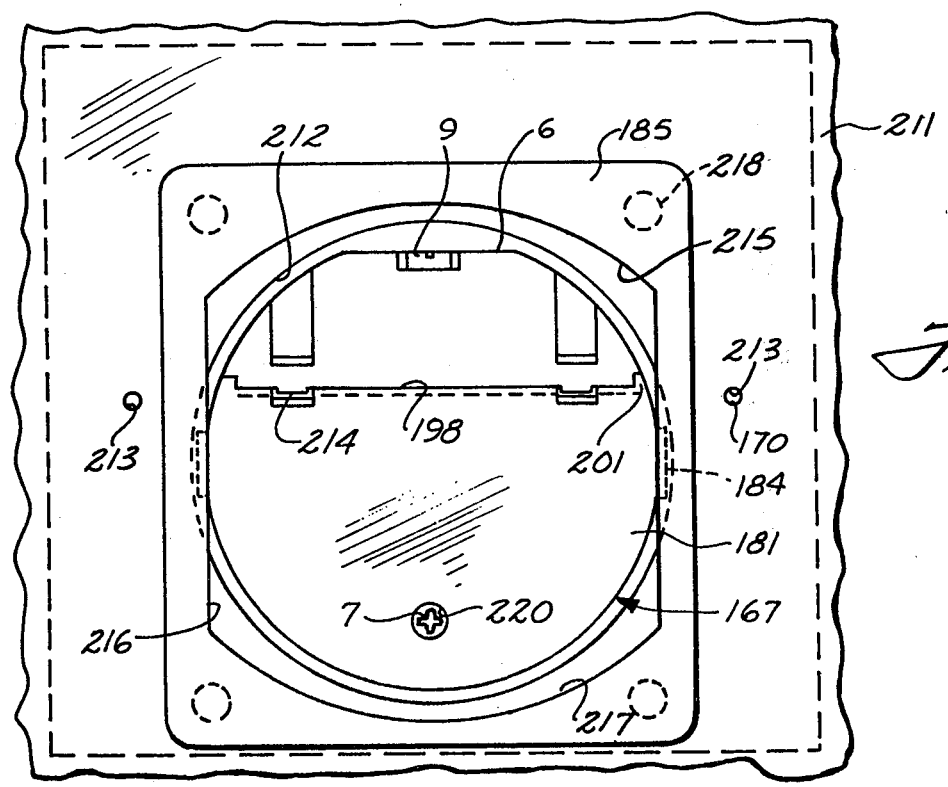
FIG. 6 is a rear view of the meter mounted on a panel and showing the panel mounting nut.

The assembled meter 1 is particularly adapted to be mounted on a flat mounting panel 211 which has a circular opening 212 to receive the body 167 of the case as shown at FIGS. 5 and 6. In addition, the panel 211 is advantageously provided with a pair of locating openings 213 spaced apart the same distance as scale locating pins 170 formed on the rear face of face plate 166. When pins 170 are inserted in the openings 213 the meter assembly is oriented in a predetermined angular position and cannot be turned.

If desired, the terminal adapter 6 can be mounted on the top wall of body 167 between ribs 201. Terminal adapter 6 is hollow to provide space for additional circuit components such as a rectifying bridge where the meter is used to measure alternating current. The adapter 6 is secured to body 167 by threading the screw 9 into the opening 202 (FIG. 3) at the rear of the body. The single screw 9 holds the adapter securely because ribs 201 prevent the adapter from shifting.

The electrical connection between the meter movement and adapter 6 is also quite simply accomplished by bending the conductors 35 and 36 which extend through the respective openings 195 and 196 upwardly and then over top wall 178 so these conductors are within the body of adapter 6. Electrical connections between the conductors 35 and 36 and the circuitry within adapter 6 can be accomplished by welding before the conductors are bent.

As shown at FIG. 6, adapter 6 has a pair of downwardly projecting tabs 214 which close the openings 195 and 196 against entry of dust and dirt into the meter casing. The rear wall of the adapter has a downwardly extending lip which seats in step 198 and provides for accurate positioning of the adapter on the body.

Meter assembly 1 is secured to panel 211 by the nut 185. Nut 185 is generally rectangular and has an opening 215 formed therein. Opening 215 has parallel side edges 216 the distance between which is only slightly greater than the width of body 167 as measured between the base portions of the teeth 184. In addition, the straight edges 216 each merge with arcuately curved edges 217 of the opening, the edges 217 being spaced apart a distance greater than the width of the body across the tips of the teeth. On the front face of the nut 185 are spacer buttons 218 which space the corners of nut 185 from rear surface 219 of panel 211. These buttons have a thickness slightly greater than the pitch of the teeth 184 to permit pressing the portions of the nut which engage teeth 184 toward rear surface 219 of the panel so the meter assembly is tightly held against the panel even though there are variations in the thickness of the panel on which the meter assembly is mounted. Hence, the spacer buttons assure that the rear surface of the face plate firmly abuts the front face of panel 211. The meter assembly can be quite simply released from its panel mounting merely by rotating nut 185 so the curved edges 217 are opposite teeth 184. In this position of the nut the teeth are completely disengaged from the nut and the meter can be removed by pushing same forwardly through the opening 212. Since nut 185 does not engage adapter 6, the nut can be used to mount the meter whether or not the adapter is used.

Meter movement 3, as shown at FIG. 1, is easily installed in casing 4. The free ends 37 and 39 of the respective conductors 35 and 36 are spaced apart the same distance as the openings 195 and 196 in the rear wall 181 of casing 4. Hence, as shown at FIG. 1, to mount the meter movement in the casing it is merely necessary to align ribs 93 and 94 at the top of the base with the tracks 193 and 194 in the casing and then slide the meter movement rearwardly until fingers 192 of the casing snap into the notches 197 on the front flange of the base whereupon the meter movement is secured to the casing. As is apparent from FIG. 1, 5 and 6, side wall 50 of base 10 cooperates with body 167 of the casing to form a compartment or casing means for meter movement 3.

During further assembly, scale 5 is snapped onto the back of face plate 166, zero adjust knob 7 is snapped into the opening 8 of cover 2 and cover 2 is snapped onto face plate 165. The conductors of terminal adapter 6 are connected respectively to the conductors 35 and 36 which now project through the rear of the casing and the terminal adapter 6 is seated on the top wall or platform 178 of the casing and secured with the screw 9. Should rectifiers or additional resistors be required these can conveniently be located in the adapter 6, which is hollow, as shown at FIG. 1. Correspondingly, adapter 6, can be used when desired to provide a compartment separate from the compartment for meter movement 3, and desired calibrating resistors can be mounted in this compartment to provide a meter with desired deflection characteristics. Where an A. C. meter is required, rectifiers can be mounted in the adapter 6. Magnet 15 is then magnetized to calibrate the meter.

As is evident from the proceeding explanation, a distinct advantage of the adapter arrangement is that the meter can be assembled, and can subsequently be provided with calibrating resistors or rectifiers, without disassembly of the meter.

As is apparent from the drawings, the rear of the meter is of a pleasing arcuate profile both with and without adapter 6, and can easily be mounted in opening 212 of panel 211 (FIGS. 5 and 6) either with or without the adapter; where the meter is secured with panel mounting nut 185.

The panel mounting nut 185 is supplied with the meter and in addition, several additional scale plates 5 can also be supplied to permit the user of the meter to simply adapt the meter for various purposes.

It is to be appreciated that the assembled meter can be provided with either the front zero adjust knob shown at FIG. 1 or a rear zero adjust knob, as shown at FIG. 6, or to make the meter even more versatile, a zero adjust knob 7 can be provided at both the front and the back of the assembled meter. This permits any desired subsequent mounting of the meter and hence, increases the versatility of the meter.

A distinct advantage of the meter construction of this invention is the same meter movement 3 can be used for meters of various sizes with no significant additional expense. The only changes required to provide any one of several different size meters are a pointer 24 of the required length for the size of the meter, and a proper counterweight to balance the meter movement. Then, it is merely necessary to select a case, scale, and cover of the appropriate size for the pointer used. It is contemplated that for example, finished meters of a size from 3 inches to 8 inches in increments of 1 inch can be provided without the necessity for any additional manufacturing steps.

While a preferred embodiment of the meter and casing arrangement of this invention have been shown and described in detail it is to be understood that numerous changes can be made in the construction described herein without departing from the spirit and scope of this invention as defined herein and in the appended claims.

What is claimed is:

1. An electrical indicating instrument adapted to be mounted on a panel having a circular opening of predetermined size comprising, casing means including wall means defining a chamber; instrument means in said chamber; said wall means presenting an exterior casing profile of part circle configuration and of a size to pass through the circular panel opening; a cover adapted to be secured to the casing means and defining a component receiving chamber; said cover and casing means presenting a profile different from the part circle configuration of the casing alone, and of a size to pass through the circular panel opening, so that the instrument can be mounted on the panel both with and without the cover, a scale, and means independent of said cover for securing the scale to the instrument, so that a complete operable indicating instrument can be provided both with and without the cover.

2. An instrument according to claim 1 wherein, said exterior casing profile is generally a segment of a circle greater than a semi-circle.

3. An instrument according to claim 2 wherein said cover has a profile generally of a segment of a circle smaller than a semi-circle, said cover and casing cooperating to present a generally circular profile.

4. An instrument according to claim 1 wherein, said instrument further includes, means connected to the casing means for abutting a face of a panel in which the instrument is mounted; and said casing means further includes, tooth means at opposite sides of said casing means; and nut means adapted to encircle said casing means both with and without the cover secured thereto, and engage said tooth means to secure the instrument to a panel.

5. An instrument according to claim 1 wherein, said indicating instrument further includes terminal means carried by the casing and exposed with respect to the casing; and conductor means connected between the instrument means and the terminal means, said conductor means extending into the component receiving chamber defined by said cover.

6. An instrument according to claim 1 wherein, said casing means includes a cover mounting platform facing upwardly when the instrument is in an upright position, and locating means adjacent said platform to facilitate positioning said cover on the casing means.

7. An instrument according to claim 6 wherein, said locating means comprises upright wall means at opposite sides of said platform.

8. An electrical panel instrument of the type adapted to be mounted by inserting a casing portion of the instrument through an opening of a predetermined size in a panel, the instrument comprising: casing means, cover adapter means connected to the casing means;

instrument means in said casing means; said casing means with the cover adapter means presenting a body of a configuration similar to the outline of the panel opening; said casing means without the cover adapter means presenting an outline like only a portion of the opening; said cover adapter means closing a component receiving chamber on said casing means; and means at the sides of said casing for securing the instrument to the panel with a nut-like element having an opening therein of a profile to extend over the cover and adapter means, so that the instrument can be secured to the panel whether or not the adapter is used.

9. A panel instrument according to claim 8 wherein, said chamber closed by the adapter means contains components ancillary to the instrument means.

10. A panel instrument according to claim 8 wherein, a conductor, connected to said instrument means extends into the chamber closed by the cover adapter means.

11. An electrical panel instrument according to claim 8 wherein, said casing means includes, a platform for mounting said adapter means, and abutment means for maintaining the adapter means in a predetermined position on the casing means.

12. An indicating instrument according to claim 4 wherein, said tooth means comprise a row of ratchet type teeth at each side of said casing, and said nut means comprises a nut having flexible tooth engaging portions to enable the nut to be snapped over the teeth in a direction toward the panel in which the instrument is mounted, to secure the instrument to the panel.

13. An instrument according to claim 8 wherein said means at the sides of said casing comprise a plurality of ratchet type teeth, and said nut-like element includes resilient tooth engaging portions to enable the nut to snap over the teeth to secure the instrument to a panel.

* * * * *